United States Patent [19]

Wehrli

[11] Patent Number: 5,270,651
[45] Date of Patent: Dec. 14, 1993

[54] METHOD AND APPARATUS FOR DIAGNOSING OSTEOPOROSIS

[75] Inventor: Felix W. Wehrli, Bala Cynwyd, Pa.

[73] Assignee: The Trustees of The University of Pennsylvania, Philadelphia, Pa.

[21] Appl. No.: 703,411

[22] Filed: May 21, 1991

[51] Int. Cl.$^5$ .............................................. G01R 33/20
[52] U.S. Cl. .................................... 324/308; 324/300; 128/653.2
[58] Field of Search ............... 324/308, 307, 309, 318, 324/310, 312; 128/653.5, 653.2, 653.1

[56] References Cited

U.S. PATENT DOCUMENTS

| | | | |
|---|---|---|---|
| 4,442,404 | 4/1984 | Bergmann | 324/315 |
| 4,510,450 | 4/1985 | Brown | 324/321 |
| 4,635,643 | 1/1987 | Brown | 324/308 |
| 4,922,915 | 5/1990 | Arnold et al. | 128/653 R |

OTHER PUBLICATIONS

F. W. Wehrli, J. C. Ford, D. A. Gusnard et al., "The Inhomogeneity of Magnetic Susceptibility in Vertebral Body Marrow", 8th Ann. Mtg. Society of Magn. Res. in Med., 217, (1989).
J. C. Ford, F. W. Wehrli, and D. A. Gusnard, "Quantification of the Intrinsic Magnetic Field Inhomogeneity of Trabecular Bone", Magn. Res. Imaging, 8, (Suppl. 1): 37, Feb. 1990.
J. C. Ford, F. W. Wehrli, and C. K. Watson, "In-Vivo Quantitative Characterization of Trabecular Bone by NMR Interferometry and Localized Proton Spectroscopy", 9th Ann. Mtg. of Society of Magn. Res. in Med. 1: 128, Nov. 1990.

Primary Examiner—Michael J. Tokar
Assistant Examiner—Raymond Y. Mah
Attorney, Agent, or Firm—Woodcock Washburn Kurtz Mackiewicz & Norris

[57] ABSTRACT

A method for noninvasively detecting osteoporosis in human subjects by means of NMR imaging is described. In the preferred embodiment, a series of images are acquired whereby the echo time TE is incremented until a predefined number of images, each differing in echo time, has been acquired. The images are then displayed, a region of interest (ROI) is selected and mean signal amplitudes are computed (block 46). The mean signal amplitude values are then used as inputs for the curve fitting procedure that computes T2* (block 48). The final step of the process compares the computed value of T2* with a normal baseline (block 50), which permits the subject to be classified as either normal or osteoporotic (block 52).

18 Claims, 4 Drawing Sheets

METHOD AND APPARATUS FOR DIAGNOSING OSTEOPOROSIS

FIELD OF THE INVENTION

The present invention generally relates to the field of characterizing bone and particularly relates to characterizing trabecular bone with nuclear magnetic resonance (NMR). The invention more particularly relates to a method and apparatus for noninvasively diagnosing osteoporosis with NMR interferometry.

BACKGROUND OF THE INVENTION

Trabecular bone consists of a three-dimensional gridwork whose individual components (the trabeculae) are plates and struts 100–300 $\mu$m thick with the mean intertrabecular space varying between about 500 and 1500 $\mu$m. The function of the trabecular structure is to provide the skeleton with mechanical strength. Trabeculation is reduced with a concomitant loss in bone strength as a result of normal aging and disease processes such as osteoporosis.

The most common method of assaying bone density is based on a measurement of the X-ray attenuation coefficient using either a projection technique (X-ray dual photon absorptiometry) or its tomographic analog, quantitative computed tomography (QCT). Although these techniques are capable of providing bone mineral densities, they do not provide information on trabecular microstructure (i.e., the geometry, thickness, orientation and density of the trabecular plates), which is commonly obtained by optical stereology, whereby thin sections of transiliac bone biopsy specimens are microscopically analyzed. There is currently no known noninvasive method for obtaining detailed information on trabecular microstructure.

Osteoporosis is a widespread disease predominantly afflicting postmenopausal women. It is a complex, multifactorial, chronic disease that may be silent for decades until resulting in fractures late in life. As a result of demineralization and gradual depletion of the trabecular microstructure, the weight-carrying capacity of the bone decreases, leading to atraumatic fractures. The two currently used methods for diagnosis and therapy follow-up are single or dual photon absorptiometry (SPA and DPA, respectively) and QCT. Those methods, however, are invasive in that they use ionizing radiation and their scope is limited in that they only measure bone mineral density (BMD), while ignoring the morphology of the trabecular structure. Moreover, those methods fails to take into account the physiological and/or biochemical state of the marrow.

The definition and diagnosis of osteoporosis has generally focused on bone density because that is the only parameter that has been quantitated in vivo. However, resistance to fracture (i.e., mechanical strength) is a function of the structural arrangement of the bone as well as the bone's density. Most osteoporotic fractures occur in the regions of the skeleton with a high proportion of trabecular bone. A high correlation has been found between vertebral body compressive strength and the density of the trabecular bone; (R=0.91 in one study, McBroom, R. J. et al., "Prediction of Vertebral Body Compressive Fracture Using Quantitative Computed Tomography," *J Bone Joint Surg* (1985) G7A:12-06–1214; and R=0.87 in another, Eriksson S. A. V., Isberg B. O. and Lindgren J. U., "Prediction of Vertebral Strength by Dual Photon Absorptiometry and Quantitative Computed Tomography," *Calcif Tissue Int* (1989) 44:243-250. Measurements using QCT (R=0.47) and DPA (R=0.74) are less predictive. This relationship may be even weaker in patients with osteoporosis since this disorder is accompanied by an unpredictable disruption of the trabecular architecture.

Histomorphometric information may be obtained in vitro by means of scanning electron microscopy of bone specimens. Histomorphometric studies of iliac crest biopsies have shown that the loss of trabecular bone may be the result of a loss of trabeculae or a thinning of individual trabecular plates. See Kleerekoper, M. et al., "The Role of Three-dimensional Trabecular Microstructure in the Pathogenesis of Vertebral Compression Fracture," *Calcif Tissue Int* (1985) 37:594–597; Parfitt, A. M. et al., "Relationships Between Surface, Volume, and Thickness of Iliac Trabecular Bone in Aging and in Osteoporosis," *J Clin Invest* (1983) 72:1396–1409. Researchers have found that increased trabecular spacing accounted for 67% of the decrease in bone volume with age, while 33% was due to trabecular thinning. See Weinstein, R.S. and Hutson, W. S., "Decreased Trabecular Width and Increased Trabecular Spacing Contribute to Bone Loss with Aging," *Bone* (1987) 9:137–142. Patients with vertebral compression fractures have been shown to have a lower trabecular plate density in biopsies of their iliac crest than osteoporotics with similar bone mineral densities (BMD's). See Kleerekoper, M. et al., "The Role of Three-dimensional Trabecular Microstructure in the Pathogenesis of Vertebral Compression Fractures," referenced above. The latter study suggests that heterogeneity with respect to trabecular plate density may account for some of the variance in fracture incidence.

Whereas with current technology bone is almost inaccessible to in vivo magnetic resonance imaging as a result of its unfavorable relaxation properties (in solids: $T1 \sim 10^1 - 10^2$ sec, $T2 << 1$ msec), bone marrow has been studied extensively by bulk proton imaging. See Dooms, G. C. et al., "Bone Marrow Imaging: Magnetic Resonance Studies Related to Age and Sex," *Radiol* (1985) 155:429–432; Pettersson, H. et al., "MR Imaging of Bone Marrow in Children: Magnetic Resonance Relaxation Characteristics of Muscle, Fat and Bone Marrow of the Extremities," *JCAT* (1986) 10:205–209; LeBlanc, A.D. et al., "The Spine: Changes in T2 Relaxation Times from Disuse," *Radiol* (1988) 169:105–107; Bloem, J. L., "Transient Osteoporosis of the Hip: MR Imaging," *Radiol* (1988) 169:753–755.

Bone marrow has also been studied with spectroscopy and spectroscopically resolved imaging. See, Luyten, P. R., Anderson, C. M. and den Hollander, J. A., "HNMR Relaxation Measurements in Human Tissues In Situ by Spatially Resolved Spectroscopy," *Magn Res Medicine* (1987) 4:431–440; Richards, T. L. et al., "Lipid/Water Ratio of Bone Marrow Measured by Phase-encoded Proton Nuclear Magnetic Resonance Spectroscopy," *Invest Radiol* (1987) 22:741–746; Rosen, B. R. et al., "Hematologic Bone Marrow Disorders Quantitative Chemical Shift Imaging," *Radiol* (1988) 169:799-804.

The large range in the apparent proton spin-lattice (T1) and spin-spin (T2) relaxation times reported has been attributed to changes in fat/water composition of the marrow since $T1,2(fat) << T1,2(water)$. Aging has been found to be associated with a decrease of the apparent T1 and T2 relaxation times, presumably as a consequence of replacement of hematopoietic marrow by fatty marrow. See Dooms, G. C. et al., "Bone Marrow Imaging: Magnetic Resonance Related to Age and Sex," *Radiol* (1985) 155:429–432; Richards, M. A. et al., "In Vivo Measurement of Spin-lattice Relaxation Time (T1) of Bone Marrow in Healthy Volunteers: The Effects of Age and Sex," *Br J Radiol* (1988) 61:30–33.

An attempted direct NMR measurement of the $^{31}P$ resonance showed that the phosphate resonance in calcium hydroxy apatite, the mineral constituent of bone, can be detected by high-resolution NMR and that it is conceivable to integrate the signal and determine the absolute concentration by calibration against a reference standard. However, this technique merely duplicates BMD measurements by QCT or absorptiometry. See, Brown et al., "Noninvasive Evaluation of Mineral Content of Bone Without the Use Ionizing Radiation," *Clin Chem* (1987) 33:2272236.

Thus, despite extensive study of trabecular bone and the causes of osteoporosis, there is no known method of characterizing the trabecular bone structure in vivo.

SUMMARY OF THE INVENTION

One of the objects of the present invention is to provide noninvasive methods and apparatus for acquiring information on trabecular bone structure. A further object of the present invention is to provide methods for acquiring quantitative information on trabecular plate density from an analysis of proton magnetic resonance imaging data. A further object of the invention is to provide methods of detecting osteoporosis by examining the spatial distribution of the magnetic field(s) within the trabecular bone of a patient.

A first embodiment of the present invention achieves these goals by providing a method for detecting a condition of a mass of bone that comprises the steps of subjecting the mass to electromagnetic energy so as to cause a time-varying response, detecting the rate of decay of the response, and comparing the rate of decay with rate of decay data corresponding to a second mass of bone having a known condition, whereby the condition of the mass of bone is determined.

In a preferred embodiment of the foregoing method, the bone is subjected to an electromagnetic pulse that causes the mass of bone to radiate electromagnetic energy.

In a second preferred embodiment, the effective transverse relaxation time T2* is detected.

In a further preferred embodiment, the detected rate of decay is compared with rate of decay data for a mass of bone that has a known trabecular structure.

In a still further preferred embodiment the detected T2* is compared with T2* data for a mass of bone that has a known trabecular structure.

A yet further preferred embodiment further comprises the step of determining on the basis of the comparison whether the condition of osteoporosis is present.

To determine the decay rate, a plurality of data points may be measured and a single-exponential curve fitted to those data points; alternatively, a plurality of data points corresponding to a plurality of spectral components may be measured and the respective rates of decay of the spectral components determined; a further alternative is to perform localized spectroscopy on the mass of bone.

The present invention also encompasses methods for detecting osteoporosis in a mass of bone comprising the steps of subjecting a patient to a pulse of electromagnetic energy so as to cause a time-varying response, detecting the effective relaxation time T2* of the response, comparing the detected T2* with a reference value, and determining on the basis of the comparison whether the patient is osteoporotic.

A further embodiment of the invention provides methods for detecting osteoporosis that are characterized by the steps of detecting the spatial distribution of a magnetic field in the mass of bone, producing a signal indicative of the spatial distribution of the magnetic field, and analyzing the signal to determine whether it is indicative of osteoporosis.

The invention also encompasses apparatus for carrying out the foregoing methods.

A preferred embodiment of the present invention employs measurement of a marrow signal modulated by the magnetic field distribution in the vicinity of the trabecular matrix/bone marrow phase boundary. The invention, which has been tested on normal subjects and subjects with independently diagnosed osteoporosis, is based on line broadening caused by the intrinsic inhomogeneity of trabecular bone secondary to spatial variations of the magnetic susceptibility between bone (calcium phosphate) on the one hand, and soft tissue structure (water, lipids in the bone marrow) on the other hand. The intrinsic inhomogeneity causes the phases of the spin isochromats to disperse, resulting in decay of the transverse magnetization with a time constant T2* (rather than T2, as in a perfectly homogeneous field).

T2* is not directly related to bone density, as measured by absorptiometric techniques. Rather, it is governed by the geometry, thickness and density of trabecular plates. It thus provides information not previously accessible in vivo. During the aging process bone demineralization leads to alterations in trabecular structure, including a reduction in the number of trabeculae per unit volume; as a result, the intrinsic magnetic field becomes more homogeneous, which causes an increase in T2*.

T2* is determined, in accordance with the present invention, by mapping the free induction signal to an equation of type:

$$S(t) = S_0 \exp(-t/T2^*) \quad (1)$$

where S(t) represents the signal intensity at time t following excitation, from which T2*, the time constant for the signal decay, is derived. This is achieved, e.g., by acquiring gradient-echo images at two or more echo times and computing the average of the signal from a region of interest (ROI) in the vertebral bodies.

Alternatively, a T2* image may be generated by performing a pixel-by-pixel regression analysis of the linearized form of the equation for S(t) given above. See Wehrli et al., "The Dependence of Nuclear Magnetic Resonance (NMR) Image Contrast on Intrinsic and Pulse Sequence Timing Parameters," *Magn Res Imaging* (1984) 2:3–16; MacFall et al., "Methodology for the Measurement and Analysis of Relaxation Times in Proton Imaging," *Magn Res Imaging* (1987) 5:209–220. The advantage of this approach is that T2*, the quantity characterizing trabecular bone density, can be directly read from arbitrary regions of interest without the need for further processing.

A third embodiment employs a measurement of the line width $\Delta v$, in Hertz($=1/\pi T2^*$), derived from localized proton spectra such as the ones obtainable by the STEAM technique. See Frahm et al., "Localized High-resolution Proton NMR Spectroscopy Using Stimulated Echoes: Initial Applications to Human Brain In Vivo," *Magn Res Medicine* (1989) 9:79-93.

In a preferred embodiment of the invention, the data is obtained from a series of gradient-echo images, acquired by stepping the echo delay (TE) in small increments (e.g., 1 ms steps) over a range of values (e.g., from 9–18 ms). The signal is typically found to decay as an amplitude-modulated exponential function. The modulation is caused by the spectral components of marrow (fat and water) adding constructively and destructively during the decay process. See Wehrli et al., "Chemical Shift-induced Amplitude Modulation in Images Obtained with Gradient Refocusing," *Magn Res Imaging* (1987) 5:157. The decay curve is therefore called an interferogram and this particular version of the method is called MR interferometry.

Other features of the invention are described below in connection with the detailed description of the preferred embodiments.

DETAILED DESCRIPTION OF PREFERRED EMBODIMENTS

Whereas in isotropic materials the effect of the magnetic dipoles cancels, uncanceled magnetic "charges" remain at the boundary, resulting in a distribution of the magnetic field, i.e., the magnetic field becomes inhomogeneous at the boundary of two materials of different susceptibility. Therefore, inhomogeneous materials are characterized by zones of nonuniform magnetic fields. The extent of local field inhomogeneity can be inferred from a measurement of the effective transverse relaxation time T2*, which is related to the spread in magnetic field $\Delta B$ as follows:

$$1/T2^* = 1/T2 + \gamma \Delta B \qquad (2)$$

where $\gamma$ represents the gyromagnetic ratio, 1/T2 represents the true transverse relaxation rate and $\gamma \Delta B$ is the contribution to the effective transverse relaxation rate caused by the spread in magnetic field across the sample. Because the spin dephasing caused by $\Delta B$ is reversible by means of phase-reversal RF pulses (spin-echo), the effect is not perceptible in spin-echo imaging. Equation 2 is strictly valid only for monoexponential relaxation, however, as shown below, it is a valid approximation.

Qualitative support for the susceptibility theory is provided by the distinguishing signal properties of gradient and spin-echo images. In the case of trabecular bone, the magnetic field inhomogeneity is caused by the structural heterogeneity of the calcium apatite versus marrow constituents. The different diamagnetic susceptibility of the two macroscopic regions causes a distribution of magnetic fields $\Delta B$ and field gradients in the boundary zones between the two entities. Since the density of trabecular plates decreases during the normal aging process and to a greater extent in osteoporosis, so will the degree of spatial magnetic field inhomogeneity; thus either process induces a prolongation of T2*.

Figure 2:
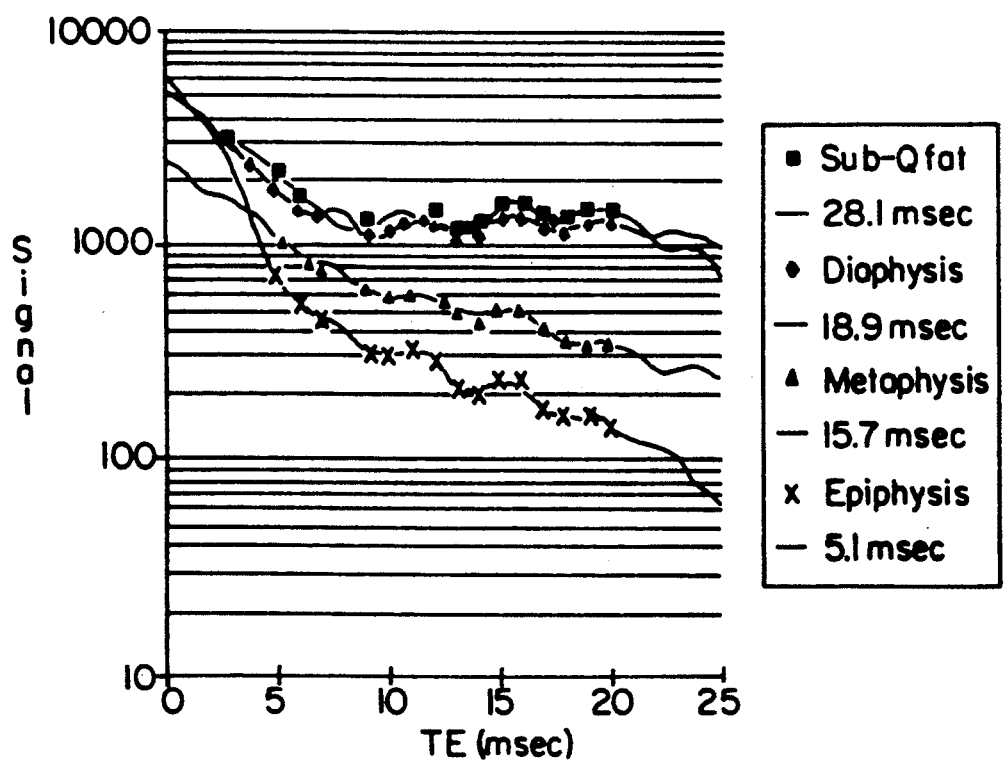
FIG. 2 is a plot similar to FIG. 1, except that equation (6) (set forth below) was fitted to the ROI signal amplitudes and certain simplifying assumptions (described below) were made.

To test the theory behind the present invention the inventor chose the distal femur, wherein the trabeculation is know to vary. Qualitative MR evidence for this behavior has recently been discovered in a study that found a progressive decrease in gradient-echo signal amplitude with increasing echo delay, primarily in the epiphyseal portion of the bone. Representative gradient-echo images illustrating this behavior are shown in FIG. 2 of Ford, J. C., Wehrli, F. W. and Watson, C. K., "In Vivo Quantitative Characterization of Trabecular Bone by NMR Interferometry and Localized Proton Spectroscopy," *Magn Res Medicine* (1991) 17:543-551, which is hereby incorporated by reference into the instant application as if fully set forth herein. In addition, it has been discovered that there is an amplitude modulation of the signal due to the presence of different chemical shift components, primarily the $CH_2$ protons of the fatty acid chains and the CH olefinic protons from unsaturated fatty acid moieties.

The methodology presented below was evaluated in trabecular bone of the distal femur in four normal volunteers (age 25 to 31, means 28), one female and three males. The rationale for the choice of the distal femur is twofold: First, the known variation in trabecular density (epiphysis>metaphysis>>diaphysis) renders it uniquely suited for testing the methodology. Second, the marrow in the distal portion of the femur, consisting almost exclusively of yellow marrow, is chemically homogeneous. Hence, other potential sources of line broadening from susceptibility effects, such as arising from iron in red blood cells, can be excluded.

Three different approaches for quantification of this effect have been developed: single-exponential fitting, interferometry and localized spectroscopy.

Single-Exponential Fitting

Figure 1:
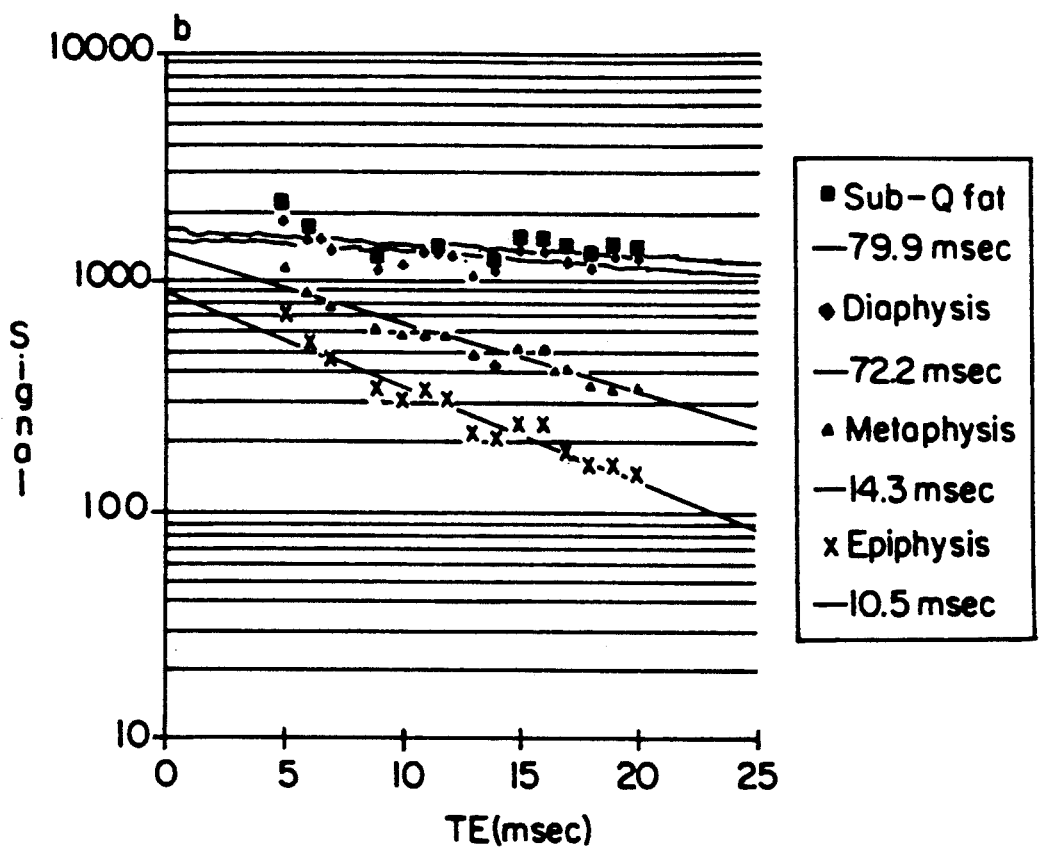
FIG. 1 is a representative semilogarithmic plot and linear regression of gradient-echo signal amplitude versus TE, showing different decay rates and amplitude modulation for trabecular structures.

The first approach involves a direct image-based measurement of T2* assuming a simple monoexponential decay of the gradient-echo amplitude with echo delay (TE). For this purpose an array of gradient echoes may be collected. FIG. 1 shows a semilogarithmic plot of an ROI signal from the multiple ROI's indicated in FIG. 3A of "In-vivo Quantitative Characterization of Trabecular Bone By NMR Interferometry and Localized Proton Spectroscopy," fully referenced above, and representing epiphysis, metaphysis, diaphysis and subcutaneous fat, where the straight lines were computed from a least-squares linear regression of log(S) versus TE.

This approach ignores the chemical shift-induced amplitude modulation of the signal, for which a period of 4.5 ms was found, consistent with a chemical shift difference of 220 Hz or 3.5 ppm at 1.5 T field strength resulting from the aliphatic $CH_2$ protons and olefinics in the fatty acid chains (rather than the $CH_2$ protons and water). This approach is useful as long as data points are collected over several modulation periods, in which case the modulation merely adds coherent noise to the data, which increases the uncertainty of the fit. Experimental data indicates the expected systematic differences in decay constant (T2*) for the four tissues samples, with T2* (epiphysis)<T2* (metaphysis)<<T2* (diaphysis<T2* (subcutaneous fat).

Interferometry

A more sophisticated analysis involves a determination of T2* for the various spectral components. It is readily recognized that the image data I=f(TE) has the characteristic of an interferogram $$I = |\Sigma_i I_i| = \{\Sigma_i \Sigma_j I_i I_j \cos(\Delta TE_{ij} + \Delta\phi_{ij})\}^{\frac{1}{2}}, \quad i \neq m \quad (3)$$

where $I_i$ represents the quadrature signal of the ith spectral component, $\Delta\omega_{ij}$ the frequency difference between the ith and jth components and $\Delta\omega_{ij}$ the initial phase between the ith and jth components. $I_i = I_{oi} \exp(-TE/T2^*_i)$ is the T2*-weighted modulus signal amplitude of the ith component. Summation is over all spectral components. T2* for the various components may then be obtained by performing a multiparameter curve fit to Equation (3). This may be accomplished by means of a Marquardt $\chi^2$ minimization procedures, which is described below.

Equation (3) reveals that as the number of spectral components increases the number of adjustable parameters increases very rapidly. E.g., for four spectral components, the total number of parameters is 14 (four amplitudes, four decay constants, three difference frequencies, and three phase factors). Simplifications can be made, however. First, one can assume that the line broadening for all spectral components is the same (the molecular dimensions are negligible relative to the spatial extent of the inhomogeneity ($\Delta B$) giving rise to line broadening). Second, the frequency differences are readily obtained from the well known chemical shifts and from the in vivo spectrum. Unresolved spin-spin coupling, another possible source of line broadening, may be ignored (although it may not be negligible for the long T2* regions (e.g., diaphysis)). These simplifications lead to a total of eight parameters (four amplitudes, three phase differences, and a single line broadening factor $\Delta B$). T2* may then be computed from Equation (2) using known values for T2.

The results of such a four-component fit are shown in FIG. 2. T2* for the major spectral component in the four regions (epiphysis, metaphysis, diaphysis, and subcutaneous fat) is: 5.1±0.2 ms (epiphysis), 15.7±2.3 ms (metaphysis), 18.9 35 1.1 ms (diaphysis), and 28.1±2.3 ms (subcutaneous fat), thus following the same trend as established with single-exponential fitting. Note that for epiphysis and metaphysis the results are in fair agreement with those from single-exponential fitting, whereas for diaphysis and subcutaneous fat there is a substantial discrepancy.

In the lumbar vertebrae there are only two detectable spectral components, those related to the $CH_2$ resonance of the fatty acid chains and water. The respective T2* values for the two components is very similar if we assume that the line broadening is dominated by susceptibility broadening and that hematopoietic and fatty constituents are exposed to similar gradient fields. Support for this assumption is provided by small-volume localized spectroscopy. Stimulated-echo (STEAM) volume-selective spectra that were acquired showed in one volunteer that the line width averaged over all five lumbar vertebrae was not significantly different for the two spectral components. See FIG. 5 of Wehrli, F. W. et al., "Magnetic Resonance Interferometry: A Preliminary Application to the Study of Trabecular Structure," Radiology, in press, which is hereby incorporated by reference as if fully set forth herein; hence other line broadening effects, such as broadening of the $CH_2$ resonance due to its spin-spin multiple structure, appear to be masked by susceptibility broadening. This finding warrants the analysis of the interferogram in terms of the single time constant T2*.

Equation 3 thus can be simplified to:

$$I = \{(I_w)^2 + (I_f)^2 + 2I_w I_f \cos\{\Delta\omega TE + \Delta\phi\}\}^{\frac{1}{2}} \quad (4)$$

where $$I_w = I_{wo} \exp(-TE/T2^*),$$

$$I_f = I_{fo} \exp(-TE/T2^*),$$

$I_{wo}$ and $I_{fo}$ represent the amplitudes of the initial water and fat signal components and $\Delta\phi$ represents a phase factor. This reduces the number of adjustable components to four (T2*, $I_w$, $I_f$ and $\Delta\phi$).

$I_{wo}$ and $I_{fo}$, which are by-products of the analysis, are proportional to the fat and water concentration ($c_f$ and $c_w$, respectively):

$$I_{wo} \sim c_w\{1 - \exp(-TR/T1)\} \text{ and}$$

$$I_{fo} \sim c_f\{1 - \exp(-TR/T1)\}.$$

Since sampling must occur at a frequency greater than the Nyquist frequency (which is approximately 420 Hertz in the present case), a sampling time interval of one millisecond corresponds to about two-fold oversampling. Images were acquired by means of a slice-interleaved gradient-echo technique with the following parameters: TR=400 ms, $\alpha$=90°, 128×256 matrix, field of view=24 cm, NEX=2 and the echo delay incremented in 1 ms intervals from 9 to 18 ms.

On two subjects a spin-echo-derived T2 value was also obtained by acquiring two 4-echo data sets, with TEs of 20, 40, 60 and 80, and 35, 70, 105 and 140 ms, on which a biexponential T2 analysis was performed. A comparison of the long component of T2 derived from spin-echo data from a typical volunteer indicates that the ratio T2/T2* is much greater for the vertebral bodies (approximately 4.5) than for the intervertebral discs (approximately 1.2), lending additional support to the theory that the shortening of T2* in the marrow is of an intrinsic nature.

$\chi^2$ Minimization Procedure

The four adjustable parameters (T2*, $I_w$, $I_f$ and $\Delta\phi$) are assumed to be constant over the ROI from which the signal versus TE data is taken. This is a fair assumption, as effects from macroscopic magnetic field inhomogeneity are negligible for the voxel size that was used (1.9×0.9×5 mm³). T2* is therefore determined by line broadening due to the magnetic field inhomogeneity over a single voxel. Thus, T2* reflects the degree of inhomogeneity of local fields that have a spatial extent on the order of the voxel size. This is in contrast to the artificially shortened $T2^*$ that is derived from spectroscopy data, which data is hampered by line broadening from global field inhomogeneities on the order of the spectroscopy voxel.

A $\chi^2$ minimization procedure may be used to fit the mean ROI signal amplitudes to Equation 4. The Marquardt algorithm (see Marquardt, D. W., "An Algorithm for Least-squares Estimation of Non-linear Parameters," *J Soc Ind Appl* (1963) 11:431), which combines the best features of a simple gradient search on the $\chi^2$ hypersurface with the method of linearizing the fitting function, may be employed. A gradient search may be employed to bring the point on the $\chi^2$ hypersurface to a region near the $\chi^2$ minimum (the hypersurface was assumed to be parabolic in the parameters). Expansion of the fitting function to second order in a Taylor expansion as a function of the fitted parameters reveals that in this region the solution may be found by a linear least-squares method and the $\chi^2$ minimum rapidly converged upon. To assure that the global minimum is attained, the algorithm should be repeated from numerous starting points (e.g., 100) on the $\chi^2$ hypersurface. This algorithm provides estimates of the four fitted parameters and their uncertainties and takes about one minute to execute on a VAX 11/780 (when implemented in FORTRAN).

Localized Spectroscopy

Since $T2^*$ also characterizes the spectral line width $\Delta v (\Delta v = 1/\pi T2^*)$, spatially localized spectroscopy and spectroscopic imaging are possible alternatives to image-based $T2^*$ analysis. The STEAM (stimulated echo) method (see Frahm J. et al., "Localized High-resolution Proton NMR Spectroscopy Using Stimulated Echos: Initial Applications to Human Brain In Vivo," *Mag Res Medicine* (1989) 9:79-93) (currently the preferred method for localized proton spectroscopy) is readily available and has excellent localization capability. STEAM is an image-based single-voxel technique The principle is to detect a stimulated echo from three 90° pulses, each applied in the presence of one of the three orthogonal slice selection gradients. In this manner a cube or parallelepiped is selected. Gradient shimming (x,y,z) may be performed interactively by signal optimization for maximum peak height. The preferred voxel size is $1 \times 1 \times 1$ cm$^3$, which represents a compromise between the need for sufficient SNR and minimal line broadening from magnetic field inhomogeneity. Ten to thirty averages may be collected and the spectrum may subsequently be transferred to a PC-based processing system for phase correction and plotting.

Figure 3:
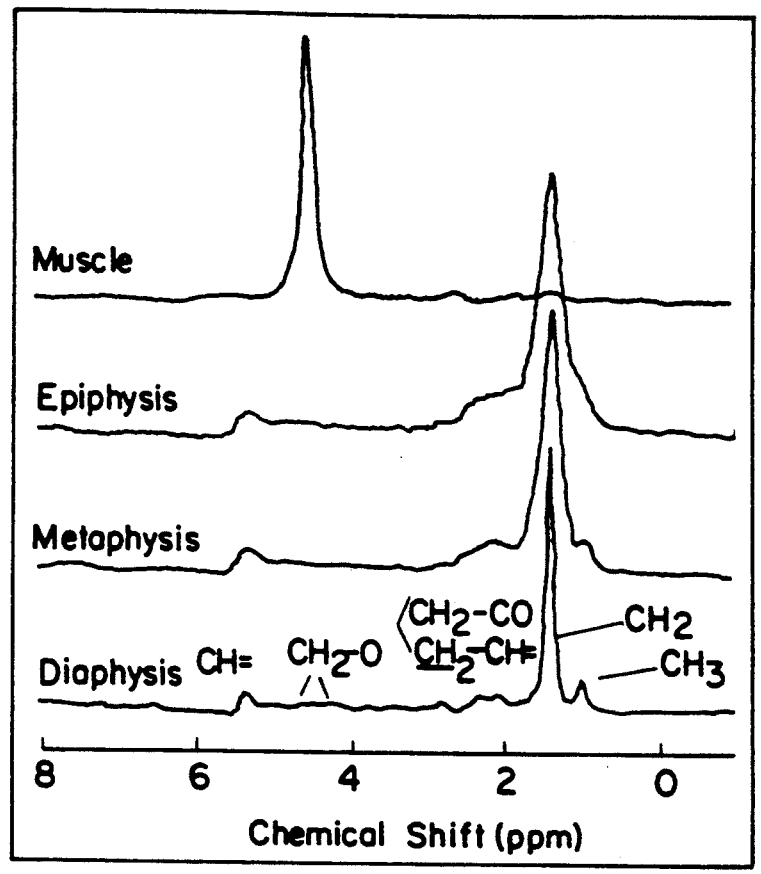
FIG. 3 is a representative plot of localized proton spectra that shows the broadening of the $CH_2$ resonance from diaphysis toward epiphysis.

FIG. 3 shows spectra corresponding to four anatomic locations (diaphysis, metaphysis, epiphysis, muscle) obtained in this manner (note the broadening of the $CH_2$ resonance from diaphysis toward epiphysis, consistent with increased trabeculation causing increased spatial inhomogeneity). The spectra were acquired from 1 cm$^3$ voxels, each corresponding to 21 averages. The spectra confirm the total absence of water in the three anatomic regions of the distal femur, showing resonances (from low to high frequency), pertaining to $CH_3$ ($\delta = 0.9$), $CH_2CH_2(\delta = 1.5)$, $CH_2$—CO and $CH_2$—CH=($\delta = 2.0$–$2.2$), $CH_2$—O($\delta = 4.0$–$4.2$), and $C\overline{H}$=($\delta = 5.3$) in fatty acid triglycerides. In none of the spectra is spin-spin coupling resolved. As expected, the line width of the $CH_2$ protons increases in this order, corresponding to $T2^*$s of 44, 22, and 16 ms in the diaphysis, metaphysis, and epiphysis, respectively, in good agreement with the imaging results. These experiments again show an inverse relationship between the degree of trabecular plate density and $T2^*$.

Another embodiment of the invention, which circumvents the problem of fitting the time-variant signal to an interferogram, makes use of frequency-selective suppression of one of the spectral components (e.g., the fat component). See Keller, P. J. et al., "Multisection Fat-Water Imaging With Chemical Shift Selective Presaturation," *Radiol* (1987) 164:539–541. Suppressing the fat component, e.g., largely eliminates the modulation and a direct fit to Equation (1) can be performed and $T2^*$ extracted. Alternatively, the water component can be suppressed and the fat component monitored.

Figure 4:
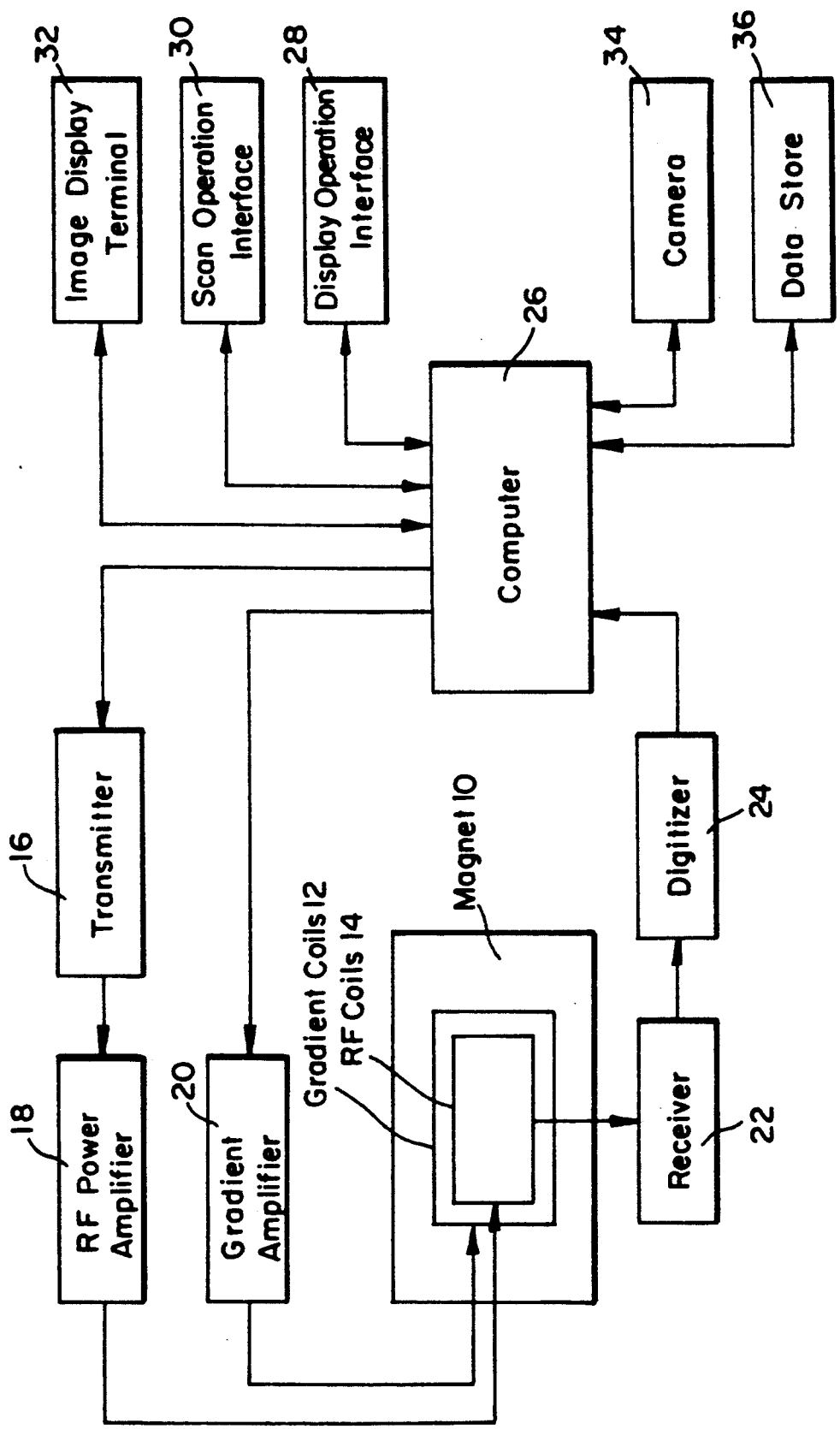
FIG. 4 is a block diagram of a magnetic resonance imager.

FIG. 4 is a block diagram of a magnetic resonance imager that may be programmed to noninvasively detect osteoporosis in accordance with the present invention. The magnetic resonance imager comprises a magnet 10, gradient coils 12, RF coils 14, transmitter 16, RF power amplifier 18, gradient amplifier 20, receiver 22, digitizer 24, computer 26, display interface 28, scan operation interface 30, image display terminal 32, camera 34 and data store 36. Each of the components depicted in FIG. 4, except for the computer 26, is standard equipment in commercially available magnetic resonance imagers. The computer 26 is unique in that it includes program code (not shown) that embodies the present invention; i.e., the computer is programmed to acquire and analyze data to detect osteoporotic bone.

Figure 5:
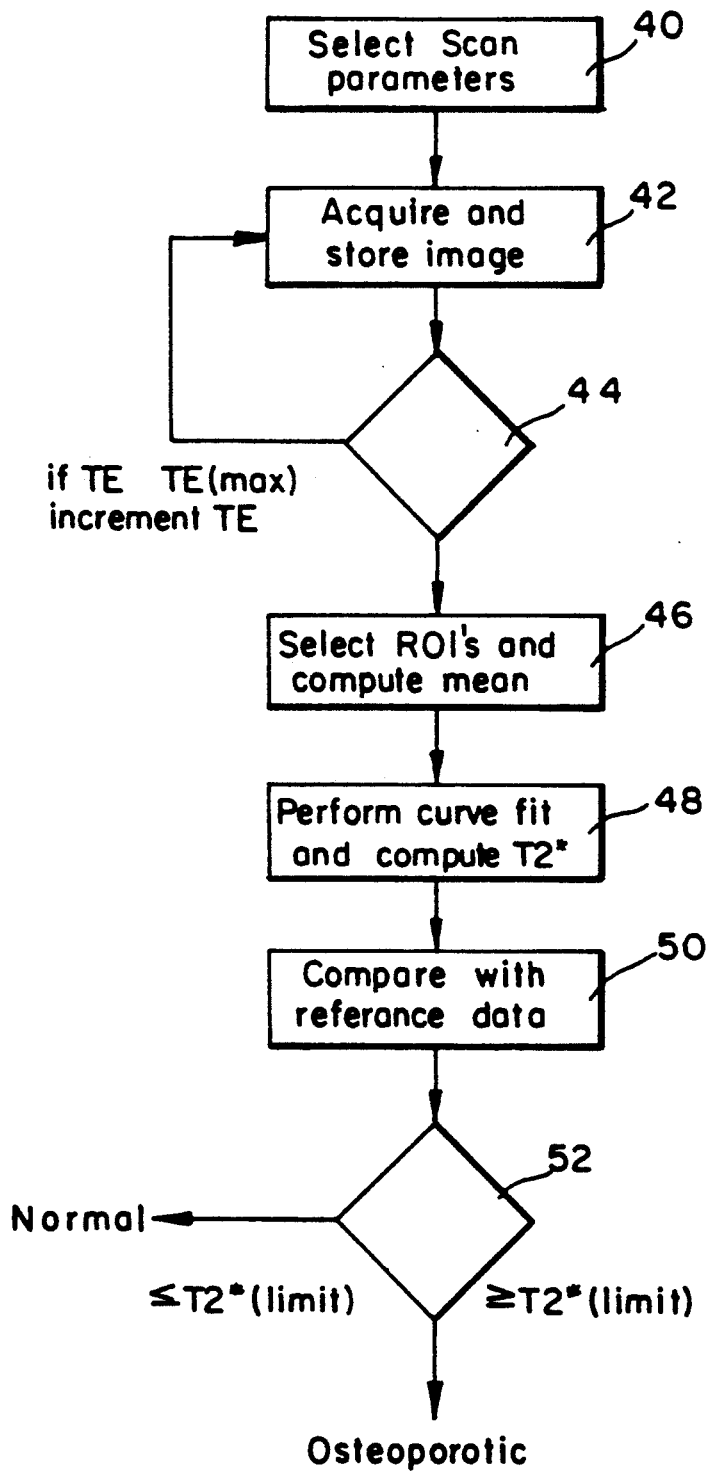
FIG. 5 is a flow diagram of one method for detecting osteoporotic bone, in accordance with the present invention.

FIG. 5 is a flow diagram of the operation of the apparatus of FIG. 4. The process starts with the selection of scan parameters (block 40) and acquisition of an image (blocks 42, 44). The echo time TE is incremented until a predefined number of images, each differing in echo time, has been acquired. The images are then displayed, a region of interest (ROI) is selected and mean signal amplitudes are computed (block 46). The mean signal amplitude values are then used as inputs for the curve fitting procedure that computes $T2^*$ (block 48). The final step of the process compares the computed value of $T2^*$ with a normal baseline (block 50), which permits the ROI to be classified as either normal or osteoporotic (block 52).

Figure 6:
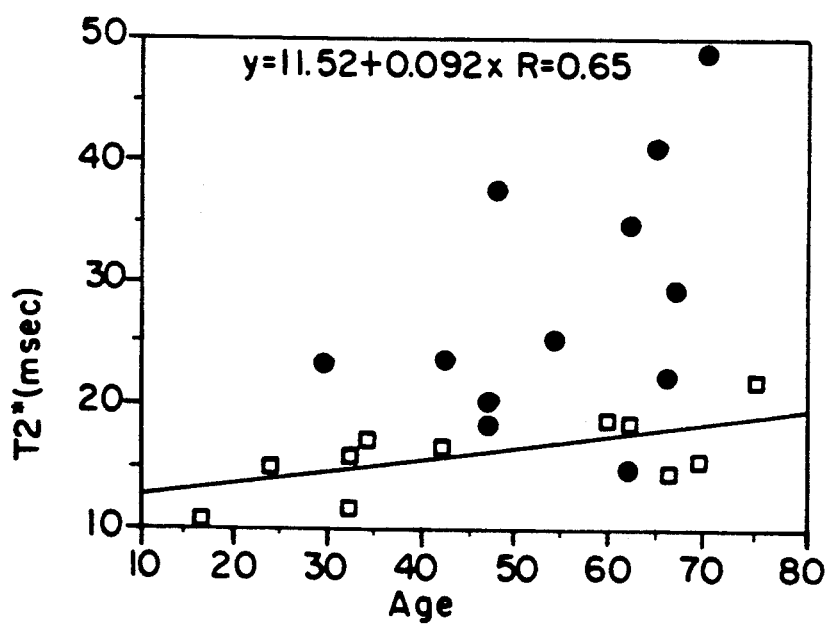
FIG. 6 is a plot of T2* versus age for the L5 lumbar vertebrae in twelve normal females and twelve osteoporotic patients.

The method disclosed has been applied to studies on normal subjects and patients with clinically established osteoporosis. An age related reduction in trabecular plate density should lessen the magnetic field inhomogeneity caused by the susceptibility variations between bone and marrow, which are the cause of the shortening of $T2^*$ ordinarily found for marrow hydrogen in the intertrabecular bone cavities, and thus lead to a prolongation of $T2^*$. In a group of twelve normal volunteers there was a significant age related increase of $T2^*$ with $T2^*$ increasing at a rate of 0.09 ms per year (R=0.65). Patients with osteoporosis had $T2^*$ values that were significantly prolonged and that covered a large range, with extremes of nearly 50 ms, with little overlap with the normal subjects. In order to evaluate the significance of these findings the $T2^*$ values for normal and osteoporotic subjects were adjusted for the mean age of the osteoporotic subjects using the age dependence found in normal females. The mean adjusted $T2^*$ of patients with osteoporosis was significantly greater than that for normal subjects (P=0.01). FIG. 6 depicts a graph showing the age dependence of $T2^*$ in twelve normal subjects and twelve osteoporotic patients.

What is claimed:

1. A nuclear magnetic resonance method for detecting a condition of a mass of bone in a subject, comprising the steps of:
   (a) subjecting the mass of bone to electromagnetic energy so as to cause a time-varying response indicative of the geometry of trabeculae in the mass of bone;
   (b) detecting an effective transverse relaxation time $T2^*$ associated with said response;
   (c) comparing said $T2^*$ with $T2^*$ data corresponding to a second mass of bone having a known condition, whereby the condition of the mass of bone is determined.

2. The method recited in claim 1, wherein step (a) comprises subjecting the bone to an electromagnetic pulse.

3. The method recited in claim 2, wherein step (c) comprises comparing the detected $T2^*$ with $T2^*$ data for a mass of bone that has a known trabecular structure.

4. The method recited in claim 3, further comprising the step of determining on the basis of the comparison whether the subject is osteoporotic or normal.

5. The method recited in claim 4, wherein step (b) comprises measuring a plurality of data points and fitting a single-exponential curve to said plurality of data points.

6. The method recited in claim 4, wherein step (b) comprises measuring a plurality of data points corresponding to a plurality of spectral components and determining respective rates of decay of said spectral components.

7. The method recited in claim 4, wherein step (b) comprises performing localized spectroscopy on the mass of bone.

8. The method recited in claim 4, further comprising the step of suppressing a spectral component.

9. A nuclear magnetic resonance method for detecting osteoporosis, comprising the steps of:
   (a) subjecting a subject to a pulse of electromagnetic energy so as to cause a time-varying response;
   (b) detecting the effective relaxation time $T2^*$ of the response:
   (c) comparing the detected $T2^*$ with a reference; and
   (d) determining on the basis of the comparison whether the subject is osteoporotic.

10. The method recited in claim 9, further comprising measuring a plurality of data points and fitting a single-exponential curve to said plurality of data points.

11. The method recited in claim 9, further comprising measuring a plurality of data points corresponding to a plurality of spectral components and determining respective rates of decay of said spectral components.

12. The method recited in claim 9, further comprising performing localized spectroscopy on the subject.

13. An apparatus for detecting a condition of a patient, comprising:
   (a) means for subjecting the mass of bone to electromagnetic energy so as to cause a time-varying response indicative of the geometry of trabeculae in the mass of bone;
   (b) detecting means for detecting an effective transverse relaxation time $T2^*$ associated with said response;
   (c) processing means, coupled to said detecting means, for comparing said $T2^*$ with a reference and providing an indication of whether or not said mass of bone is osteoporotic.

14. The apparatus recited in claim 13, wherein element (a) comprises means for subjecting the mass of bone to an electromagnetic pulse.

15. The apparatus recited in claim 14, wherein said processing means comprises means for comparing the detected $T2^*$ with $T2^*$ data for a mass of bone that has a known trabecular structure.

16. The apparatus recited in claim 15, wherein said detecting means comprises means for measuring a plurality of data points and fitting a single-exponential curve to said plurality of data points.

17. The apparatus recited in claim 15, wherein said detecting means comprises means for performing localized spectroscopy on the mass of bone.

18. The apparatus recited in claim 15, further comprising means for suppressing a spectral component.

* * * * *

UNITED STATES PATENT AND TRADEMARK OFFICE
CERTIFICATE OF CORRECTION

PATENT NO. : 5,270,651
DATED : December 14, 1993
INVENTOR(S) : Felix W. Wehrli and John Chetley Ford It is certified that error appears in the above-identified patent and that said Letters Patent is hereby corrected as shown below:

On title page, at [75], after "Inventor" the patent should read:

Inventor: Felix W. Wehrli, Bala Cynwyd, Pa. and John Chetley Ford, Wallingford, Pa.

Signed and Sealed this

Fourteenth Day of June, 1994

*Attest:*

BRUCE LEHMAN

*Attesting Officer*     *Commissioner of Patents and Trademarks*